(12) United States Patent
Hung et al.

(10) Patent No.: US 12,713,851 B2
(45) Date of Patent: Aug. 18, 2026

(54) METHODS FOR PATTERNING SUBSTRATES TO ADJUST VOLTAGE PROPERTIES

(71) Applicant: Applied Materials, Inc., Santa Clara, CA (US)

(72) Inventors: Steven C. H. Hung, Sunnyvale, CA (US); Srinivas Gandikota, Santa Clara, CA (US); Yixiong Yang, San Jose, CA (US); Yong Yang, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 611 days.

(21) Appl. No.: 18/139,382

(22) Filed: Apr. 26, 2023

(65) Prior Publication Data

US 2023/0377901 A1 Nov. 23, 2023

Related U.S. Application Data

(60) Provisional application No. 63/364,856, filed on May 17, 2022.

(51) Int. Cl.
*H10P 32/20* (2026.01)
*H10P 50/00* (2026.01)
*H10P 50/28* (2026.01)

(52) U.S. Cl.
CPC ............ *H10P 32/20* (2026.01); *H10P 50/283* (2026.01); *H10P 50/73* (2026.01)

(58) Field of Classification Search
CPC ........ H10P 32/20; H10P 50/283; H10P 50/73; H10P 14/6518; H10P 14/69392; H10D 84/0144; H10D 84/038; H10D 84/83
See application file for complete search history.

(56) References Cited

U.S. PATENT DOCUMENTS

2019/0371676 A1* 12/2019 Bao .................... H10D 84/0144
2019/0371903 A1* 12/2019 Bao .................... H10D 30/6735
2021/0375629 A1* 12/2021 Lai ..................... H10D 64/0134

* cited by examiner

*Primary Examiner* — Ratisha Mehta
*Assistant Examiner* — Sophia W Kao
(74) *Attorney, Agent, or Firm* — Patterson + Sheridan, LLP

(57) ABSTRACT

A method of forming a structure on a substrate is provided. The method includes depositing a dipole dopant containing (DDC) layer including a dipole dopant on a first and second region of a dielectric layer (DL) of the substrate. A hardmask (HM) is deposited over the DDC deposited on the first and the second regions. A patterned photoresist layer (PR) is formed over the HM. The PR includes a first portion that is positioned over the first region and an opening that is positioned to expose a portion of the HM that is disposed over the second region of the substrate. The HM and DDC within the second region are etched and at least a portion of the DL is exposed within the second region. The PR is removed and the substrate is annealed to diffuse the dipole dopant into a portion of the DL disposed in the first region.

12 Claims, 12 Drawing Sheets

METHODS FOR PATTERNING SUBSTRATES TO ADJUST VOLTAGE PROPERTIES

CROSS-REFERENCE TO RELATED APPLICATIONS

This application claims benefit of U.S. Provisional Application Ser. No. 63/364,856, filed May 17, 2022, of which is incorporated by reference in its entirety.

BACKGROUND

Field

Embodiments of the present disclosure relate to a method of processing substrates and, more specifically, to adjusting threshold voltage of portions of substrates by forming electrostatic dipole layers between dielectric layers and semiconducting films.

Description of the Related Art

Semiconductor devices such as an IC (integrated circuit) generally have electronic circuit elements, such as transistors, diodes and resistors fabricated integrally on a single body of semiconductor material. The various circuit elements are connected through conductive connectors to form a complete circuit, which can contain millions of individual circuit elements. Advances in semiconductor materials and processing techniques have resulted in reducing the overall size of the IC while increasing the number of circuit elements. Additional miniaturization is highly desirable for improved IC performance and cost reduction. Control of threshold voltage of transistors is important for use in various devices including gate modules and can be a challenge as gate lengths shrink.

Therefore, there is a need for methods of forming structures on substrates and modulating threshold voltage in different regions of the substrates.

SUMMARY

In one embodiment, a method of forming a structure on a substrate is provided. The method includes depositing a dipole dopant containing layer including a dipole dopant on a first region and a second region of a dielectric layer formed on the substrate. A hardmask is deposited over the dipole dopant containing layer deposited on the first and the second regions. The method includes forming a patterned photoresist layer over the hardmask. The patterned photoresist layer includes a first portion that is positioned over the first region and an opening in the photoresist layer that is positioned to expose a portion of the hardmask that is disposed over the second region of the substrate. The method includes exposing the substrate to an etchant to etch the hardmask and dipole dopant containing layer within the second region and expose at least a portion of the dielectric layer within the second region. The method includes removing the patterned photoresist layer from the substrate and annealing the substrate to diffuse the dipole dopant into a portion of the dielectric layer disposed in the first region.

In one embodiment, a method of forming a structure on a substrate is provided. The method includes depositing a dipole dopant containing layer comprising a dipole dopant on a first region and a second region of a dielectric layer formed on a substrate. The method includes depositing a protective layer over the dipole dopant containing layer and depositing a hardmask over the protective layer. The method includes forming a patterned photoresist layer over the hardmask. The patterned photoresist layer includes a first portion that positioned over the first region and an opening in the photoresist layer that is positioned to expose a portion of the hardmask that is disposed over the second region of the substrate. The method includes exposing the patterned photoresist layer to an etchant to etch the hardmask, protective layer, and dipole dopant containing layer and expose at least a portion of the dielectric layer within the second region. The method includes removing the patterned photoresist layer and removing the hardmask from the first region. The method includes forming a silicon-containing cap layer over the first and second region and annealing the substrate to diffuse the dipole dopant into a portion of the dielectric layer disposed in the first region.

In one embodiment, a method of forming a structure on a substrate is provided. The method includes depositing a dipole dopant containing layer comprising a dipole dopant on a first region and a second region of a dielectric layer formed on a substrate. The method includes depositing a hardmask comprising an amorphous silicon-containing layer over the dipole dopant containing layer. A patterned photoresist layer is formed over the hardmask. The patterned photoresist layer includes a first portion that positioned over the first region and an opening in the photoresist layer that is positioned to expose a portion of the hardmask that is disposed over the second region of the substrate. The method includes exposing the patterned photoresist layer and substrate to an etchant to etch the hardmask and dipole dopant containing layer and expose at least a portion of the dielectric layer within the second region. The method includes removing the patterned photoresist layer and annealing the substrate to diffuse the dipole dopant into a first portion of the dielectric layer disposed in the first region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure provided herein includes processes for forming structures on substrates and tuning a threshold voltage of the structures for various uses. Threshold voltage tuning is achieved by depositing dipole dopant layers over gate dielectric layers and annealing the dipole dopants into the underlying dielectric layer. The process further includes providing protective layers, hardmasks, and compatible etch chemistries to protect regions of the substrate in which the threshold voltage is not being modified. The process used herein is suitable for structures having thin individual layers, such as layers of about 20 Å or less, such as about 1 Angstrom to about 10 Å.

Figure 1A:
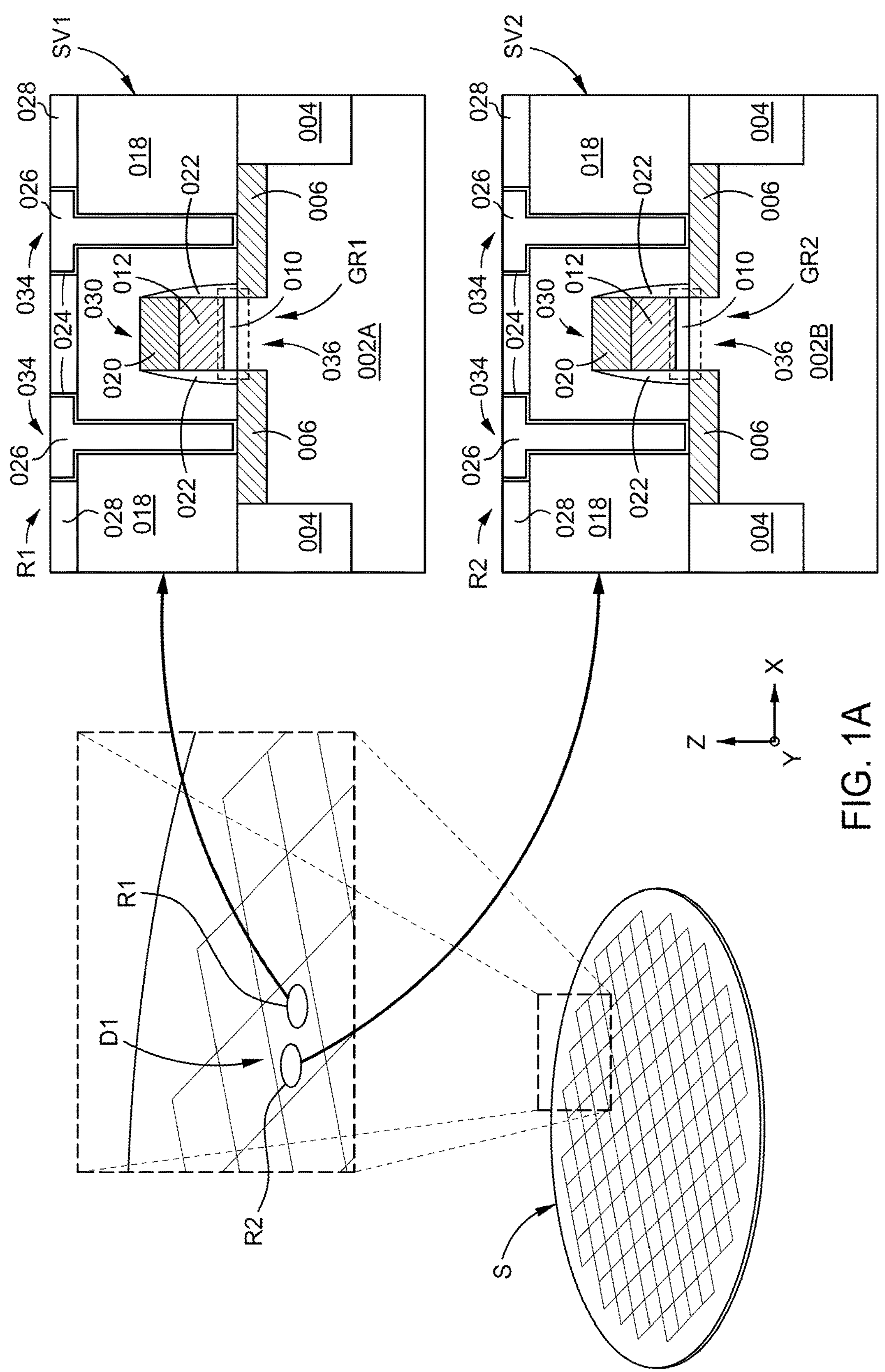
FIG. 1A depicts a perspective of a substrate and cross-sectional views of transistors disposed on the substrate, according to some embodiments.

FIG. 1A depicts a perspective of a substrate and cross-sectional views of transistors disposed on a substrate, according to some embodiments. The substrate (S) includes a die D1. The die D1 includes a first region R1 and a second region R2. A first sectional view SV1 of first region R1 is shown and a second sectional view SV2 of second region R2 is shown in FIG. 1A. In some embodiments, the first region R1 is a PMOS device having gate region GR1 and the second region R2 is a NMOS device having gate region GR2. The first region R1 can include a transistor including a p-type well region 002A with an active region defined by isolation regions 004. The second region R2 is a transistor including an n-type well region 002B with an active region defined by isolation regions 004. Each of the transistors R1, R2 may also include source/drain regions disposed within the active region. The source/drain regions may include a doped n-type regions (e.g., n-type regions), including lateral portions 006 and a first inter-layer dielectric (ILD) layer 018. As shown, the lateral portions 006 of the source/drain regions may be laterally adjacent to a semiconductor channel 036 in the well region 002A, 002B. The first ILD layer 018 may be any suitable dielectric material, such as silicon oxide, borophosphosilicate glass (BPSG), phosphosilicate glass (PSG), or the like. The first ILD layer may be deposited by chemical vapor deposition (CVD), furnace chemical vapor deposition (FCVD), atomic layer deposition (ALD), or another appropriate deposition process.

The first region R1 includes a gate structure 030, which may include a gate region GR1. Similarly, the second region R1 includes a gate structure 030, which may include a gate region GR2. Each of the gate structures 030 may include a gate oxide layer 010, a first gate metal layer 012, and optionally a second gate metal layer 020. In some embodiments, the gate structure 030 includes spacers 022.

The first region R1 and second region R2 transistor may include a metal interconnect structures 034. A second ILD layer 028, which may be a similar material as the first ILD layer 018, may be deposited in the same or a similar manner over the first ILD layer 018. The layers used to form the metal interconnect structures 034 may be deposited in the recesses formed in the first ILD layer 018 and second ILD layer 028, such as by use of CVD, ALD, or physical vapor deposition (PVD). The metal interconnect structures 034 can include a conformal barrier layer 024, such as titanium nitride (TiN), tantalum nitride (TaN), or the like, and the metal fill 026 on the barrier layer, such as tungsten (W), aluminum (Al), copper (Cu), or the like.

While FIG. 1A illustrates a configuration that includes commonly configured MOSFET devices being formed within the substrate S1, this configuration is not intending to be limiting as to the scope of the disclosure provided herein, since other types of formed device structures may benefit from one or more aspects of the disclosure provided herein. The more conventional types of devices structures illustrated herein are only presented to simplify the discussion of the processes performed herein. However, it is believed that the processes described herein will provide a significant advantage for configurations where the device that is to be formed is more structurally complex, such as multi-gate devices, which may include gate-all-around (GAA) FET devices and/or FinFET types of devices, and where conventional processing techniques (e.g., implantation) of various gate dielectric materials are not accessible due to the gate regions of these multi-gate devices being buried within many different layers of the device.

Figure 1B:
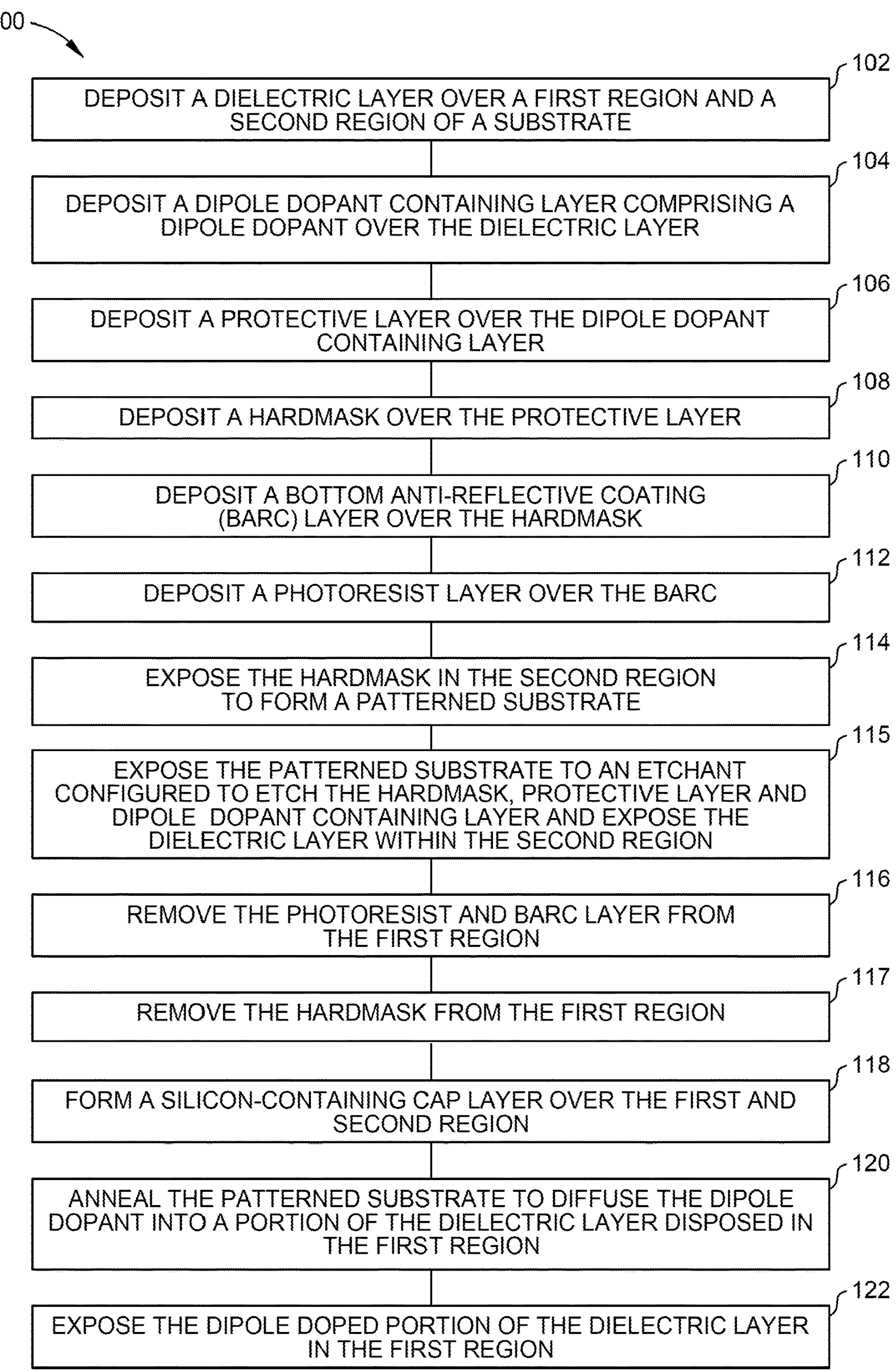
FIG. 1B depicts a process flow diagram of a method for processing a substrate, according to some embodiments.
Figures 2A, 2B:
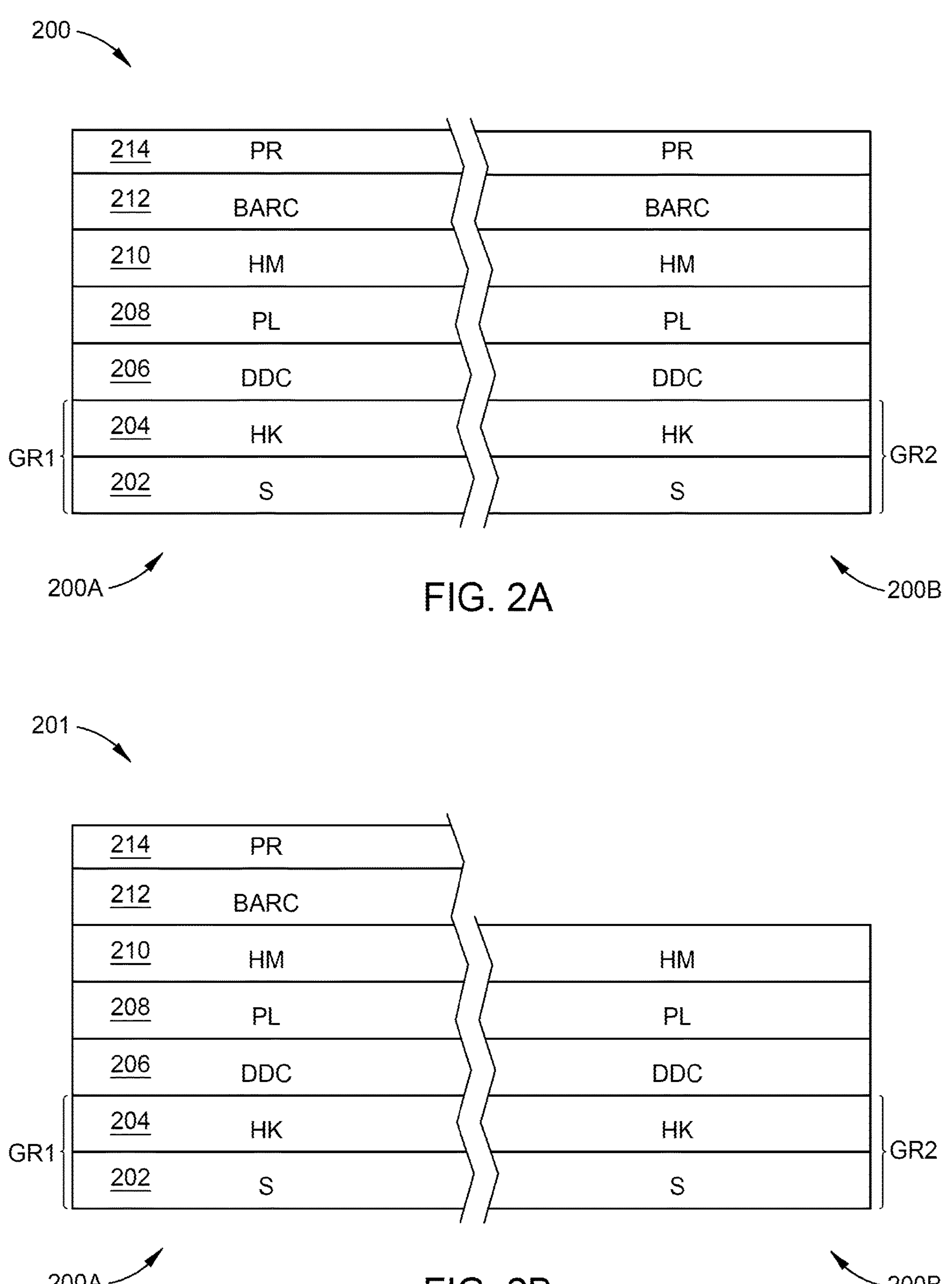
FIGS. 2A-2F illustrate schematic cross-sectional side view of a structure including a single layer hardmask disposed on a substrate at various stages of processing, according to some embodiments.

FIG. 1B depicts a process flow diagram of a method 100 of altering the characteristics of gate dielectric layer used in a field-effect-transistor (FET) device, according to some embodiments. In some embodiments, each of the layers deposited during the activities performed in method 100 are deposited using atomic layer deposition (ALD) processes. FIGS. 2A-2F illustrate schematic cross-sectional side views of a structure 200 during the various processes performed during method 100. FIG. 2A depicts a substrate 202, which can include a silicon containing substrate (e.g., n-type Si substrate, p-type Si substrate). In some embodiments, the substrate 202 can include a silicon oxide interfacial layer (not shown) formed on a silicon containing substrate.

The method includes, at activity 102, depositing a dielectric layer 204 over a first region 200A and a second region 200B of a substrate. The dielectric layer 204 includes a high-k dielectric material. As used herein, a high-k dielectric material is a material having a dielectric constant greater than a dielectric constant of silicon oxide (e.g., about 3.9). In some embodiments, the dielectric material (HK) 204 is a metal oxide. In some embodiments, the dielectric material 204 is a hafnium-containing material, a silicon containing material, a zirconium-containing material, a titanium-containing material or combinations thereof. In some embodiments, the dielectric material is a hafnium oxide containing material (e.g., $HfO_2$) or other suitable materials. The dielectric layer 204 is deposited at a thickness of about 20 Å or less, such as about 5 Å to about 15 Å. The dielectric layer 204 interfaces a silicon-containing portion of a substrate, such as a silicon dioxide portion formed on a surface of a silicon substrate. In one example, the dielectric layer is formed over a channel region of a metal gate field-effect-transistor (FET) device, and the dielectric layer includes an interfacial silicon oxide layer and a hafnium oxide layer formed thereon.

In activity 104, a dipole dopant containing (DDC) layer 206 having a dipole dopant is deposited over the dielectric layer. In general, dipole dopants include elements that form an electrostatic dipole, and are different from fixed charge types of dopants that include elements that form a positive or a negative charge due to the loss or gain of an electron when doped within a dielectric material. While not intending to be bound by theory, the presence of a dipole dopant in a dielectric film is believed to lead to a surface potential at an interface of the dielectric layer, which leads to dielectric polarization in the dielectric film. The dielectric polarization caused by the presence of a desired amount of a dipole dopant in a gate dielectric layer can then be used to adjust a threshold voltage (i.e., $V_t$) of the FET device. In some embodiments, it is desirable to dope different regions of the gate dielectric layer (e.g., metal gate interface surface, interface surface between a High-k layer and an interfacial dielectric layer, or channel interface surface) to further adjust the $V_t$ of a FET. The dipole dopant in the dipole dopant containing layer 206 can be a metal dopant, such as aluminum (Al) or lanthanum (La). The dipole dopant containing layer provides the dipole dopant that is to be diffused into the dielectric layer by subsequent annealing.

Depositing the dipole dopant containing layer includes depositing the dipole dopant containing layer to a thickness of about 3 Å to about 10 Å, such as about 5 Å to about 8 Å. In some embodiments, the dipole dopant containing layer is a metal nitride, such as titanium nitride that further includes dipole dopants. In some embodiments, a dipole dopant concentration in the dipole dopant containing layer is about 1% to about 20%, such as about 5% to about 15%, such as about 8% to about 12%. Selecting the dipole dopant concentration in the dipole dopant containing layer 206 is based on a predetermined final concentration of dopant to be diffused into the dielectric layer of the first region. The predetermined concentration of dopant to be diffused into the dielectric layer is determined based on a predetermined threshold voltage ($V_t$) of the first region or a predetermined difference in threshold voltage of a FET device formed in the first region relative to a FET device formed in the second region. In some embodiments, the dipole dopant containing layer 206 has a substantially uniform concentration of dipole dopant within the dipole dopant containing layer.

Alternatively, depositing a dipole dopant containing layer 206 includes depositing a higher concentration of dipole dopant at a first surface disposed between the dipole dopant containing layer 206 and the dielectric layer 204 relative to a second surface of the dipole dopant containing layer, the second surface opposing the first surface. In some embodiments, the dipole dopant is formed by an atomic layer deposition (ALD) process. In some embodiments, a gradient in the concentration of the dipole dopant within the dipole dopant containing layer is formed by delivering ALD pulses that contain a concentration of a dipole dopant containing precursor that is increasing every successive layer (i.e., positive gradient) or decreasing every successive layer (i.e., negative gradient) during the ALD process. In one example, about 70 at. % or more, such as about 80% or more, such as about 90% or more of the dipole dopant is disposed in a portion of the dipole dopant containing layer that is formed at an interface of the dielectric layer, such as a lower 50%, such as a lower 20% in the rest of the dipole dopant containing layer (i.e., negative gradient). In some embodiments, forming the concentration gradient of the dipole dopant includes increasing or decreasing a time of exposure (e.g., pulse time) of the dipole dopant relative to a time of exposure of the other gases during the ALD process.

In activity 106, a protective layer (PL) 208 is formed over the dipole dopant containing layer 206. The protective layer is a nitride layer, such as a silicon nitride ($SiN_x$) layer, or a metal nitride layer. In some embodiments the protective layer is a titanium silicon nitride (TiSiN) layer. Depositing the protective layer 208 includes depositing the protective layer to a thickness of about 5 Å to about 15 Å, such as about 8 Å to about 13 Å.

In activity 108, a hardmask layer (HM) 210, also referred to herein as hardmask 210, is deposited over the protective layer 208. In some embodiments, the hardmask 210 is a tungsten-carbon-nitride (WCN) layer or a lanthanum nitride (LaN) layer. The hardmask 210 is deposited over the protective layer 208 disposed in the first and second regions 200A, 200B of the substrate 202. The hardmask 210 is deposited to a thickness of about 10 Å to about 20 Å.

In activity 110 of method 100, a bottom anti-reflective coating (BARC) layer 212 is deposited over the hardmask 210 over the first region 200A. The BARC layer 212 is deposited over the first region 200A and the second region 200B of the substrate 202. The BARC layer 212 can be formed by a conventional spin-on process or a vapor phase deposition process.

In activity 112, a photoresist (PR) layer 214 is deposited over the BARC 212 in the first region 200A and second region 200B. The photoresist layer 214 can be formed by a conventional spin-on process or a vapor phase deposition process.

In activity 114, as shown in FIG. 2B, the photoresist layer 214 and BARC layer 212 are exposed and developed by use of a lithography process to expose the hardmask 210 portion of the second region 200B of the substrate 202, and thus form a patterned substrate 201. In some embodiments, the photoresist layer is a patterned photoresist layer (PR) 214 formed over the hardmask, the patterned photoresist layer includes a first portion that is positioned over the first region 200A and an opening in the photoresist layer that is positioned to expose a portion of the hardmask that is disposed over the second region 200B of the substrate 202.

In activity 115, the patterned substrate 201 is exposed to an etchant that is configured to etch the hardmask 210, protective layer 208 and dipole dopant containing layer 206, and expose the dielectric layer 204 within the second region 200B. The etching process can be performed using a wet etchant including water, ammonium hydroxide, and hydrogen peroxide, such as an SC1 chemistry. In some embodiments, the etch chemistry consists of an SC1 etchant at a 5:1:1 ratio by volume of water to 28% ammonium hydroxide solution to 30% hydrogen peroxide. In some embodiments, the hardmask includes a tungsten-carbon-nitride (WCN) layer, and the exposing the hardmask to an etchant includes exposing the WCN layer to a solution that essentially includes water.

Figure 2C:
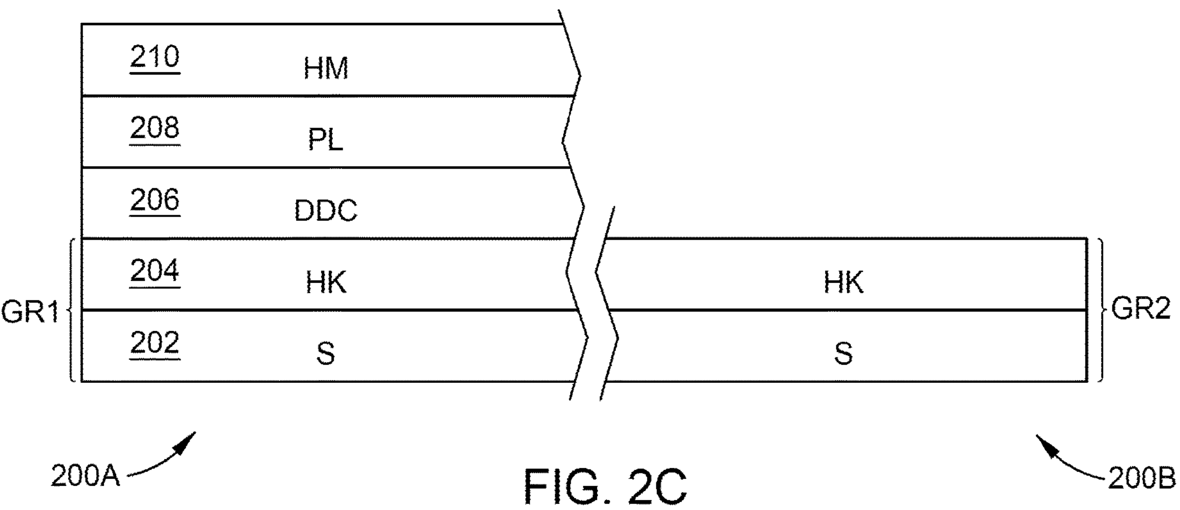

In activity 116, as shown in FIG. 2C, the photoresist layer 214 and BARC layer 212 are removed from the first region 200A by use of an ashing process, or other conventional photoresist and BARC removal process, to expose the hardmask 210 portion of the first region 200A of the substrate 202.

Figure 2D:
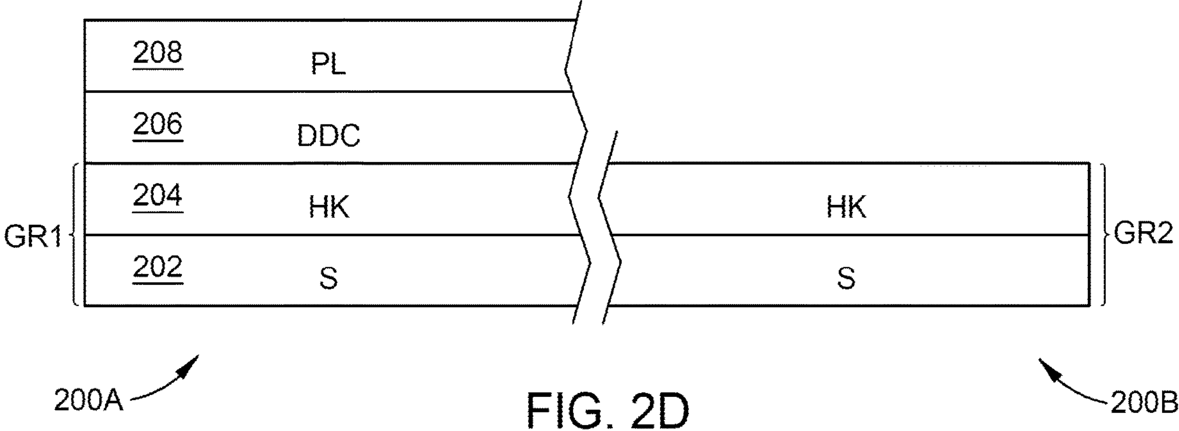

In activity 117, as shown in FIG. 2D, the hardmask 210 is removed from the first region 200A of the substrate 202. In some embodiments, the hardmask 210 includes WCN, which can be removed during activity 117 by exposing the hardmask 210 to water. The process of etching the hardmask layer 210 in activity 117 is useful since the exposure of the portions of the layers in the first region 200A, which are adjacent to the second regions 200B, will not be undercut due to the exposure to the hardmask etchant (e.g., water), while the hardmask 210 in the first region 200A is being removed. Removal of portions of the layers in the first region 200A, other than the hardmask layer 210, can cause variations in the results of this device formation process. In one example, a process that would etch and undercut the DDC layer 206 will reduce the amount of the dipole dopant that is available to diffuse into the dielectric layer 204 during a subsequent dopant drive-in step (e.g., activity 120). In some embodiments, the hardmask 210 includes WCN and is removed using process that includes exposing the first region 200*a* and second region 200B to water, and then exposing the first region 200*a* and second region 200B to the first etchant SC1 for about 5 seconds to about 15 seconds. In some embodiments, where the hardmask 210 includes LaN, the process performed during activity 117 includes exposing the hardmask 210 to an SC2 chemistry.

Figure 2E:
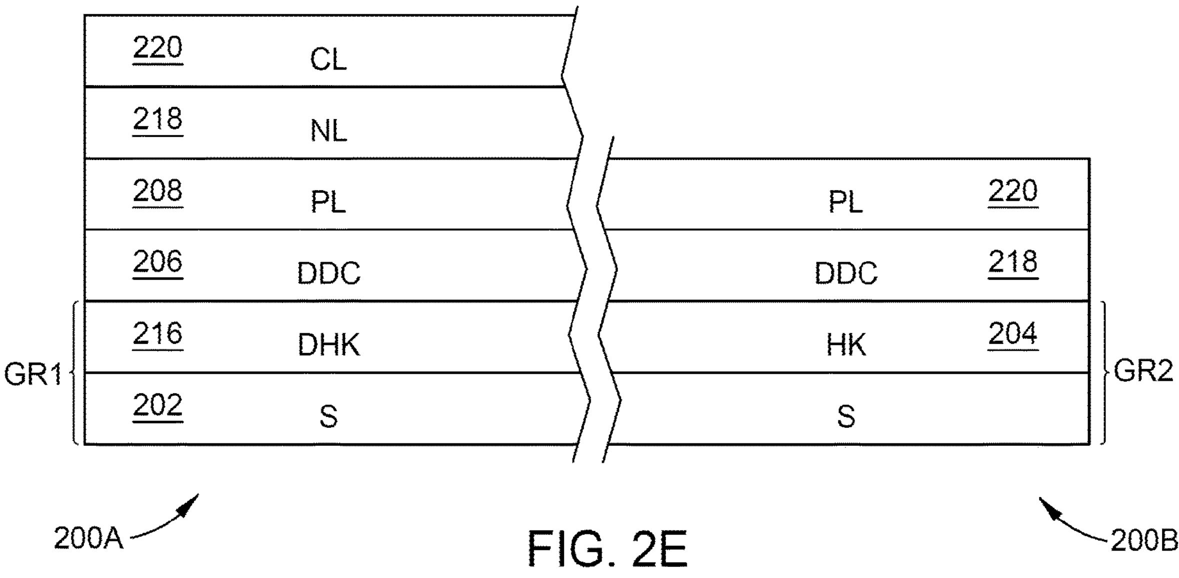

In activity 118, as shown in FIG. 2E, a silicon-containing cap layer 220 is formed over the first region 200A and the second region 200B. In some embodiments, the silicon-containing cap layer 220 includes a nitride layer (NL) 218, such as a titanium nitride (TiN) layer below a silicon-containing layer CL. The titanium nitride layer directly interfaces the protective layer 208 in the first region 200A and the dielectric layer 204 in the second region. The silicon-containing cap layer 220 is formed having a thickness of about 10 Å to about 20 Å. The titanium nitride layer is formed having a thickness of about 5 Å to about 15 Å.

In activity 120, the substrate is annealed at a temperature of about 600° C. to about 1100° C., such as about 800° C. to about 1000° C., or about 700° C. to about 950° C. Annealing the substrate enables the dipole dopants from the dipole dopant containing layer 206 to diffuse into the dielectric layer 204 in the first region 200A of the substrate. Without being bound by theory, in one configuration, the dipole dopant diffused into the dielectric layer produces a threshold voltage ($V_t$) shift in the dielectric layer 204 in the first region 200A, such as at an interface of the dielectric layer 204 and an underlying silicon dioxide layer formed on the substrate 202. It has been discovered that selection of the dopant type and concentration enables modulation of the voltage threshold either positively or negatively versus the threshold voltage of an undoped dielectric layer, depending on desired application. In some embodiments, the dipole dopant is a p-type dopant that is diffused into the dielectric layer 204 to induce negative polarization and lower threshold voltage. In some embodiments, other dopants are contemplated to raise the threshold voltage. It is further believed that the dipole dopant is diffused from the dipole dopant containing layer 206 to the lower portion of the dielectric layer 204 (e.g., interface of a high-k layer and silicon dioxide layer) and disturbs an oxygen density in the lower portion of the dielectric layer 204 (e.g., $HfO_x$) relative to an underlying silicon dioxide ($SiO_x$) layer formed on a silicon substrate.

Figure 2F:
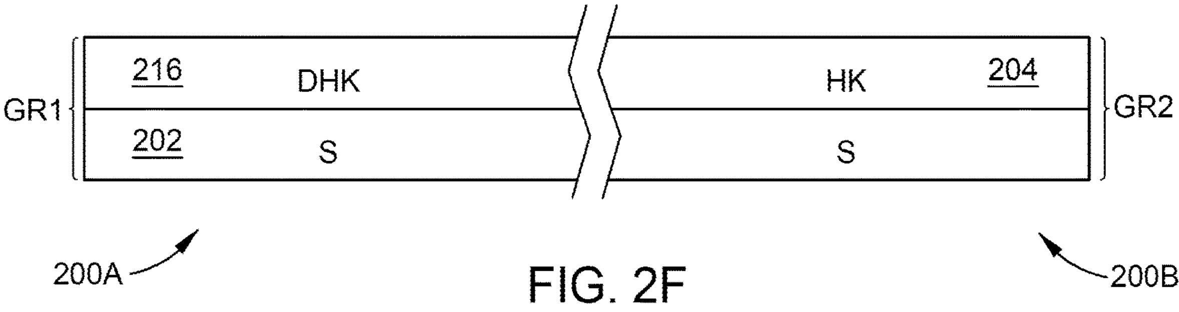

After annealing, in activity 122, as shown in FIG. 2F, the method 100 further includes etching the first and second regions 200A, 200B to expose the portion of the dielectric layer 204 comprising dipole dopant in the first region 200A and the dielectric layer 204 in the second region 200B using the first etchant SC1 and the second etchant SC2, the first etchant including water, ammonium hydroxide, and hydrogen peroxide, the second etchant including hydrogen chloride and hydrogen peroxide.

After performing activities 102-122, additional steps will be performed on the substrate 202 to form FET devices that include the dipole dopant disposed in the first region 200A (e.g., GR1) of a dielectric layer 216 and FET devices that include second region 200B (e.g., GR1) of a dielectric layer 204 to form devices that have differing and desirable $V_t$ characteristics. In some embodiments, a first field-effect-transistor (FET) is formed that has a first voltage threshold ($V_t$) value. The first field-effect-transistor (FET) includes at least a portion of the dielectric layer found in the first region (e.g., GR1) after the substrate was exposed to the annealing process. In some embodiments, a second field-effect-transistor (FET) is formed that has a second voltage threshold ($V_t$) value. The second field-effect-transistor (FET) includes at least a portion of the dielectric layer found in the second region (e.g., GR2) after the substrate was exposed to the annealing process. The first voltage threshold ($V_t$) is different from the second voltage threshold ($V_t$).

Figure 3:
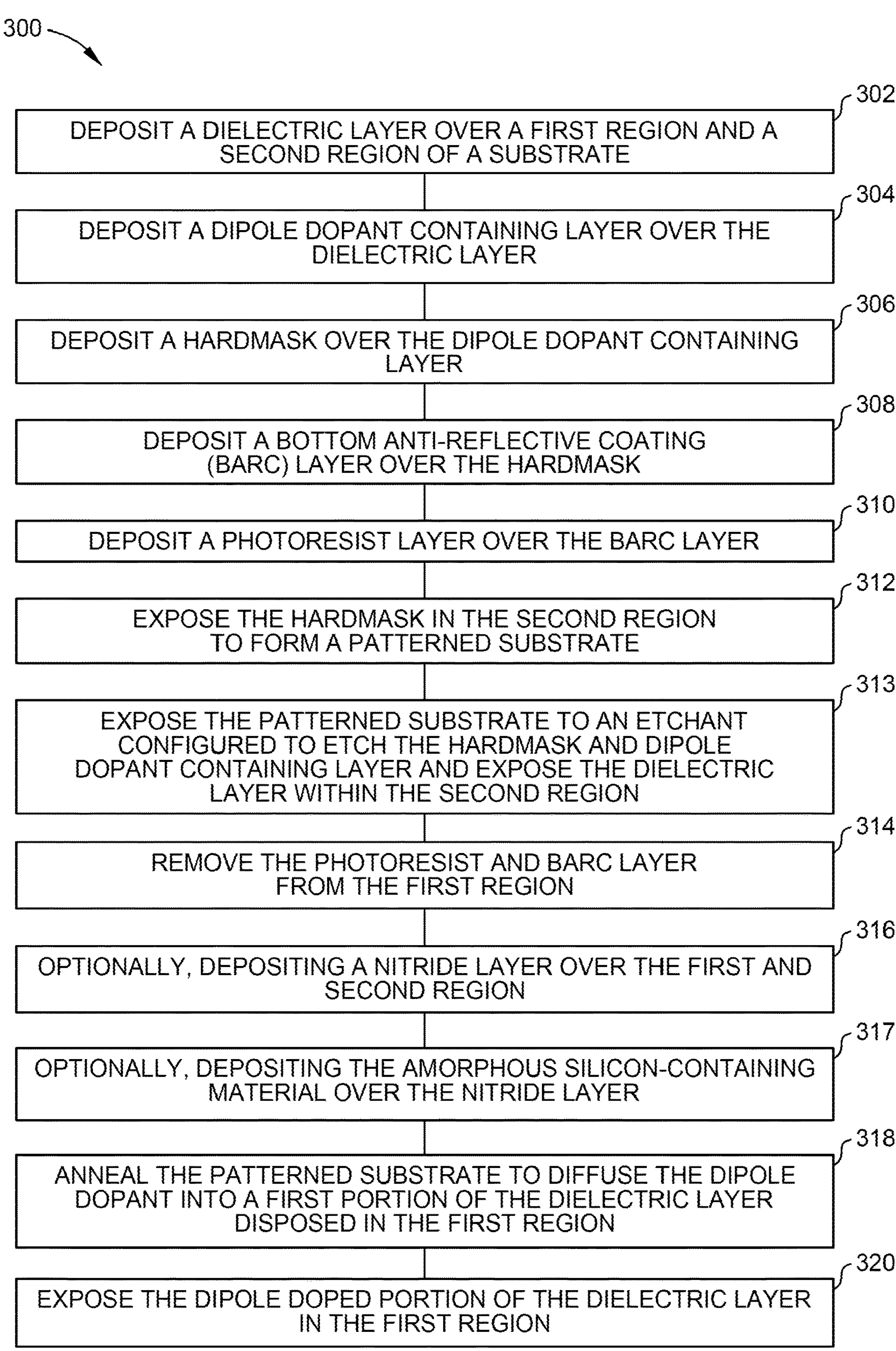
FIG. 3 depicts a process flow diagram of a method for processing a substrate, according to some embodiments.
Figures 4A, 4B:
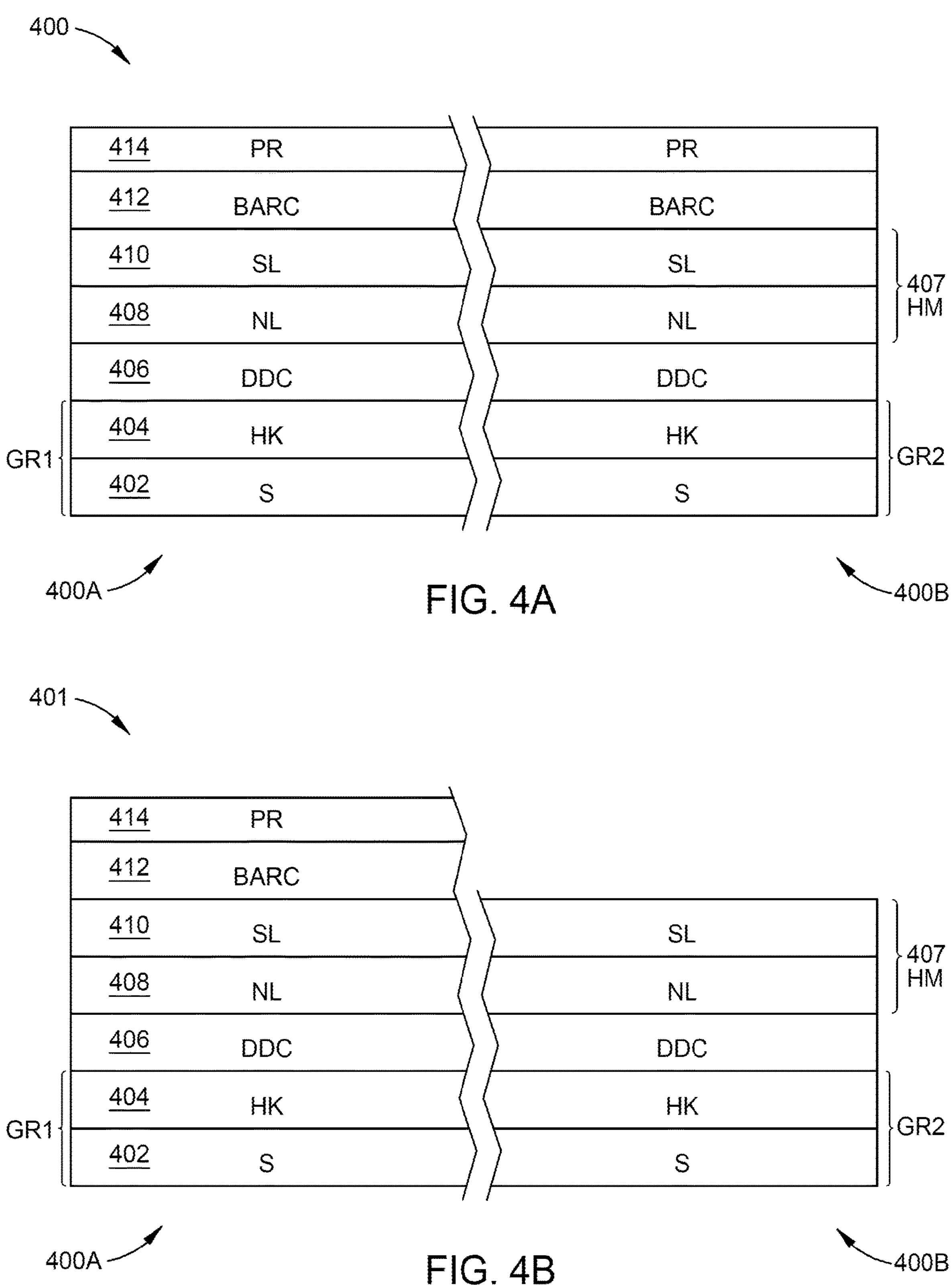
FIGS. 4A-4C illustrate schematic cross-sectional side view of a structure including a multi-layer hardmask disposed on a substrate at various stages of processing, according to some embodiments.
Figure 4C:
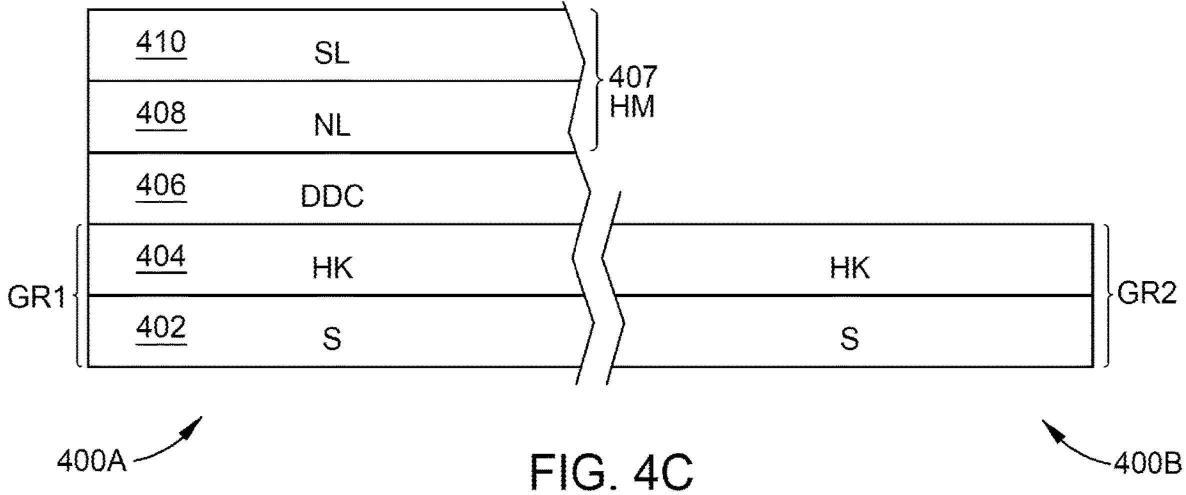

FIG. 3 depicts a process flow diagram of a method 300 of altering the characteristics of a gate dielectric layer used in a FET device, according to some embodiments. In some embodiments, each of the layers deposited during the activities performed in method 300 are deposited using atomic layer deposition (ALD) processes. FIGS. 4A-4C illustrate schematic cross-sectional side views of a structure 200 during the various processes performed during method 300. FIG. 4A depicts a substrate (S) 402, which can include a silicon containing substrate (e.g., n-type Si substrate, p-type Si substrate). In some embodiments, the substrate 402 can include a silicon oxide interfacial layer (not shown) formed on a silicon containing substrate.

The method 300 includes depositing a dielectric layer (HK) 404 over a first region 400A and a second region 400B of a substrate 402, in activity 302. Activity 302 of method 300 can be performed in a similar manner described relative to activity 102 of method 100. In activity 304, a dipole dopant-containing (DDC) layer is formed over the dielectric layer 404. Activity 304 of method 300 can be performed in a similar manner described relative to activity 104 of method 100.

In activity 306, a hardmask (HM) 407 is formed over the dipole dopant-containing layer (DDC) 406. The hardmask 407 is a multilayer mask, in which at least one layer includes an amorphous silicon material. In some embodiments, the hardmask 407 includes a metal nitride (NL) material 408, such as titanium nitride (TiN) interfacing the dipole dopant-containing layer 406 and the amorphous silicon material (SL) 410 interfacing the metal nitride material 408. In some embodiments, the hardmask 407 includes an additional metal nitride material, such as titanium nitride, interfacing the opposing side of the amorphous silicon containing material. In some embodiments, the hardmask 407 includes two or more layers of alternating layers of metal nitride 408 and amorphous silicon 410, such as three layers. It has been discovered that the multi-layer hardmask 407 disclosed herein will act as an etchant barrier and also a protective layer over the dipole dopant containing layer 406 without the need for additional protective layers disposed therebetween. The multi-layer hardmask 407 is disposed directly on the dipole dopant-containing layer 406. In some embodiments, a protective layer 408 is deposited over the dipole dopant-containing layer 406 prior to the hardmask 407.

In activity 308, a bottom anti-reflective coating (BARC) layer 412 is deposited over the hardmask 407. Activity 308 of method 300 can be performed in a similar manner described relative to activity 110 of method 100. The BARC layer 412 is deposited over the first region 400A and the second region 400B of the substrate 402. The BARC layer 412 can be formed by a conventional spin-on process or a vapor phase deposition process.

In activity 310, a photoresist layer (PR) 414 is deposited over the BARC layer 412 in the first region 400A and second region 400B. Activity 310 of method 300 can be performed in a similar manner described relative to activity 112 of method 100. The photoresist 414 can be formed by a conventional spin-on process or a vapor phase deposition process.

In activity 312, as shown in FIG. 4B, the photoresist layer 414 and BARC layer 412 are exposed and developed by use of a lithography process to expose the hardmask 407 portion of the second region 400B of the substrate 402, and thus form a patterned substrate 401.

In activity 313, the patterned substrate 401 is exposed to an etchant that is configured to etch the hardmask 407 and dipole dopant containing layer 406 within the second region 400B. The etching process can be performed using a wet etchant including water, ammonium hydroxide, and hydrogen peroxide, such as an SC1 chemistry. In some embodiments, the etch chemistry consists of an SC1 etchant at a 5:1:1 ratio by volume of water to 28% ammonium hydroxide solution to 30% hydrogen peroxide. Activity 313 of method 300 can be performed in a similar manner described relative to activity 115 of method 100. In some embodiments, the photoresist layer is a patterned photoresist layer formed over the hardmask, the patterned photoresist layer includes a first portion that is positioned over the first region 400A and an opening in the photoresist layer that is positioned to expose a portion of the hardmask that is disposed over the second region 400B of the substrate 402.

In activity 314, as shown in FIG. 4C, the patterned photoresist 414 and BARC layer 412 is removed from the first region 400A of the substrate 402. In some embodiments, the process of etching the photoresist 414 and BARC layer 412 during activity 314 includes exposing portions of the layers in the first region 400A, which can be adjacent to the second region 400B, to an ashing process, or other conventional photoresist and BARC removal process, to expose the hardmask 407 portion of the first region 400A of the substrate 402. The second region 400B will not be undercut due to the exposure to the etchant, while the photoresist 414 and BARC layer 412 in the first region 400A is removed. In some embodiments, the photoresist 414 and BARC layer 412 are removed using a process that includes exposing the first region 400A to the first etchant SC1 and the second etchant SC2 for about 5 seconds to about 15 seconds.

Figure 5A:
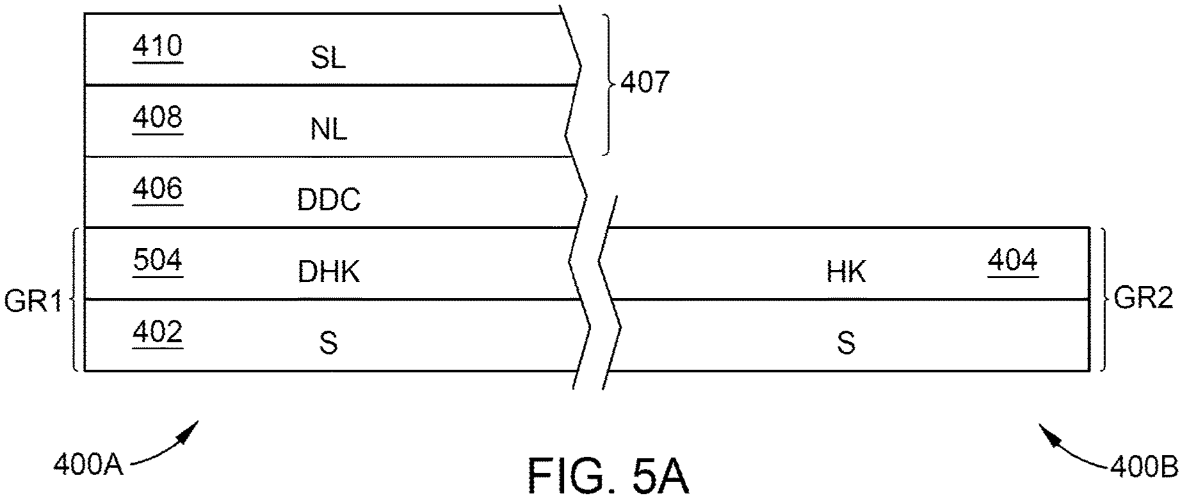
FIGS. 5A and 5B illustrate schematic cross-sectional side view of a structure including a multi-layer hardmask disposed on a substrate at various stages of processing, according to some embodiments.

In activity 318, as shown in FIG. 5A, the substrate 402 is annealed at a temperature of about 600° C. to about 1100° C., such as about 800° C. to about 1000° C. Annealing the substrate 402 enables the dipole dopants from the dipole dopant containing layer 406 to diffuse into the dielectric layer 404 in the first region 400A of the substrate 402 to form a dielectric layer containing dipole dopants (DHK) 504. Without being bound by theory, in one configuration, the dipole dopant diffused into the dielectric layer produces a threshold voltage ($V_t$) shift in the DHK 504 in the first region 400A, such as at an interface of the DHK 504 and an underlying silicon dioxide layer formed on the substrate 402. In some embodiments, the dipole dopant is a p-type dopant that is diffused into the dielectric layer 504 to induce negative polarization and lower threshold voltage. In some embodiments, other dopants are contemplated to raise the threshold voltage. It is further believed that the dipole dopant is diffused from the dipole dopant containing layer 406 to the lower portion of the dielectric layer 504 (e.g., interface of a high-k layer and silicon dioxide layer) and disturbs an oxygen density in the lower portion of the dielectric layer 504 (e.g., $HfO_x$) relative to an underlying silicon dioxide ($SiO_x$) layer formed on a silicon substrate 402.

Figure 5B:
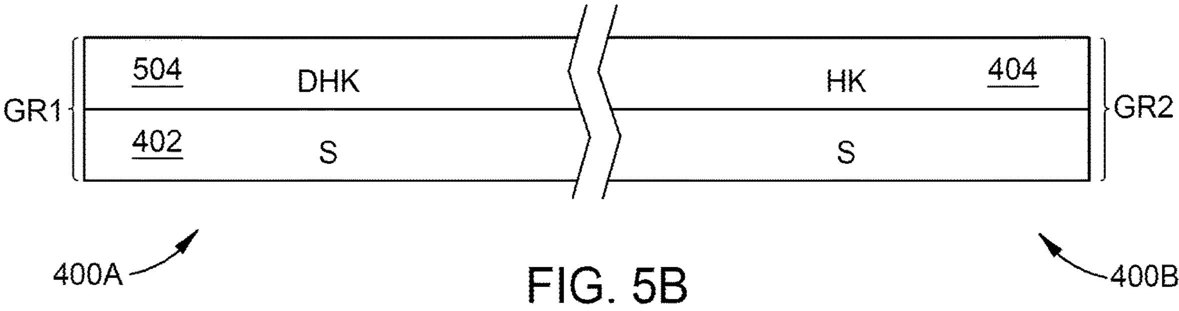

After annealing, in activity 320, as shown in FIG. 5B, the method 100 further includes etching the first and second regions 400A, 400B to expose the portion of the dielectric layer 504 containing dipole dopants in the first region 400A and the dielectric layer 404 in the second region 400B using the first etchant SC1 and the second etchant SC2, the first etchant including water, ammonium hydroxide, and hydrogen peroxide, the second etchant including hydrogen chloride and hydrogen peroxide. Activity 320 of method 300 can be performed in a similar manner described relative to activity 122 of method 100. In some embodiments, exposing the dipole doped portion of the dielectric layer in the first region and the dielectric layer in the second region includes etching using a first etchant and a second etchant, the first etchant including water, ammonium hydroxide, and hydrogen peroxide, the second etchant comprising hydrogen chloride and hydrogen peroxide.

After performing activities 302-320, additional steps will be performed on the substrate 402 to form FET devices that include the dipole dopant in the first region 400A (e.g., GR1) disposed within the dielectric layer 504 and FET devices that include the second region 400B (e.g., GR2) of the dielectric layer 404 to form devices that have differing and desirable $V_t$ characteristics. In some embodiments, a first field-effect-transistor (FET) is formed that has a first voltage threshold ($V_t$) value. The first field-effect-transistor (FET) includes at least a portion of the dielectric layer found in the first region (e.g., GR1) after the substrate was exposed to the annealing process. In some embodiments, a second field-effect-transistor (FET) is formed that has a second voltage threshold ($V_t$) value. The second field-effect-transistor (FET) includes at least a portion of the dielectric layer found in the second region (e.g., GR2) after the substrate was exposed to the annealing process. The first voltage threshold ($V_t$) is different from the second voltage threshold ($V_t$).

Figure 6A:
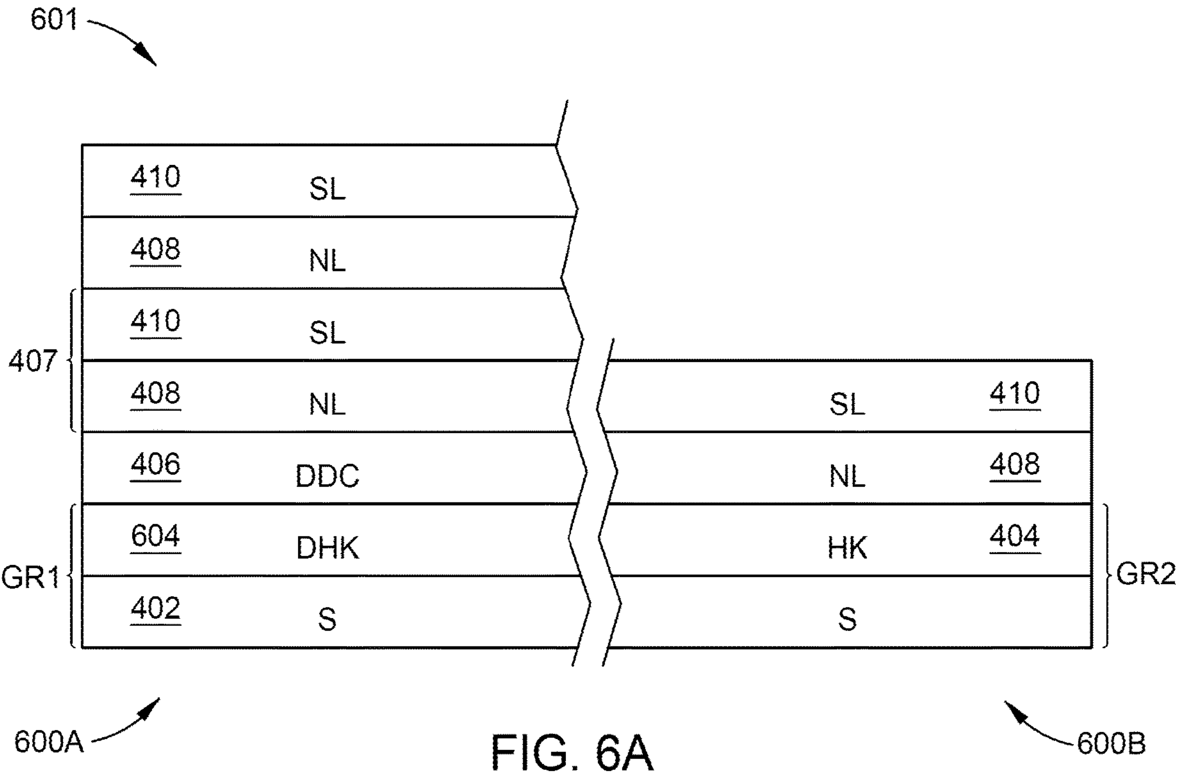
FIGS. 6A and 6B illustrate schematic cross-sectional side view of a structure including a multi-layer hardmask disposed on a substrate at various stages of processing, according to some embodiments.

In optional activity 316, as shown in FIG. 6A, prior to performing the annealing process during activity 318, a nitride layer 408 is deposited over the hardmask 407 in the first region 600A of patterned substrate 601. The nitride layer 408 can be a metal nitride layer, such as titanium nitride. In some embodiments, such as in optional activity 317, an amorphous silicon containing material 410 is deposited over the nitride layer 408. It has been discovered, that the optional nitride 408 and silicon 410 containing layers provide additional protection to the dielectric layer 404 to improve reliability during subsequent annealing as described in activity 318.

Figure 6B:
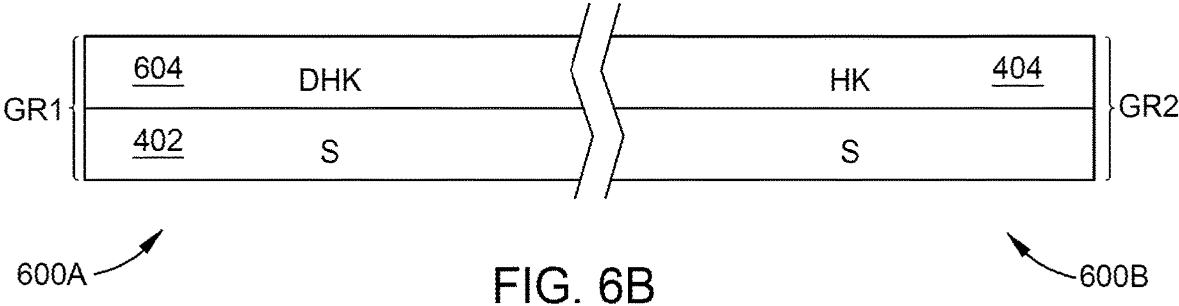

After annealing, as shown in FIG. 6B, the method 300 includes activity 320 in which the first and second regions 600A, 600B are exposed due to the etching of the portion of the dipole dopant containing dielectric layer 604 in the first region 600A and the dielectric layer 604 in the second region 600B using the first etchant SC1 and the second etchant SC2, the first etchant including water, ammonium hydroxide, and hydrogen peroxide, the second etchant including hydrogen chloride and hydrogen peroxide. Activity 320 of method 300 can be performed in a similar manner described relative to activity 122 of method 100. In some embodiments, exposing the dipole doped portion of the dielectric layer in the first region and the dielectric layer in the second region includes etching using a first etchant and a second etchant, the first etchant including water, ammonium hydroxide, and hydrogen peroxide, the second etchant comprising hydrogen chloride and hydrogen peroxide.

After performing activities 302-320, additional steps will be performed on the substrate 402 to form FET devices that include the dielectric layer 604 that includes the dipole dopant in the first region 600A (e.g., GR1) and FET devices that include the dielectric layer 404 in the second region 600B (e.g., GR2) to form devices that have differing and desirable $V_t$ characteristics. In some embodiments, a first field-effect-transistor (FET) is formed that has a first voltage threshold ($V_t$) value. The first field-effect-transistor (FET) includes at least a portion of the dielectric layer found in the first region (e.g., GR1) after the substrate was exposed to the annealing process. In some embodiments, a second field-effect-transistor (FET) is formed that has a second voltage threshold ($V_t$) value. The second field-effect-transistor (FET) includes at least a portion of the dielectric layer found in the second region (e.g., GR2) after the substrate was exposed to the annealing process. The first voltage threshold ($V_t$) is different from the second voltage threshold ($V_t$).

Figure 7A:
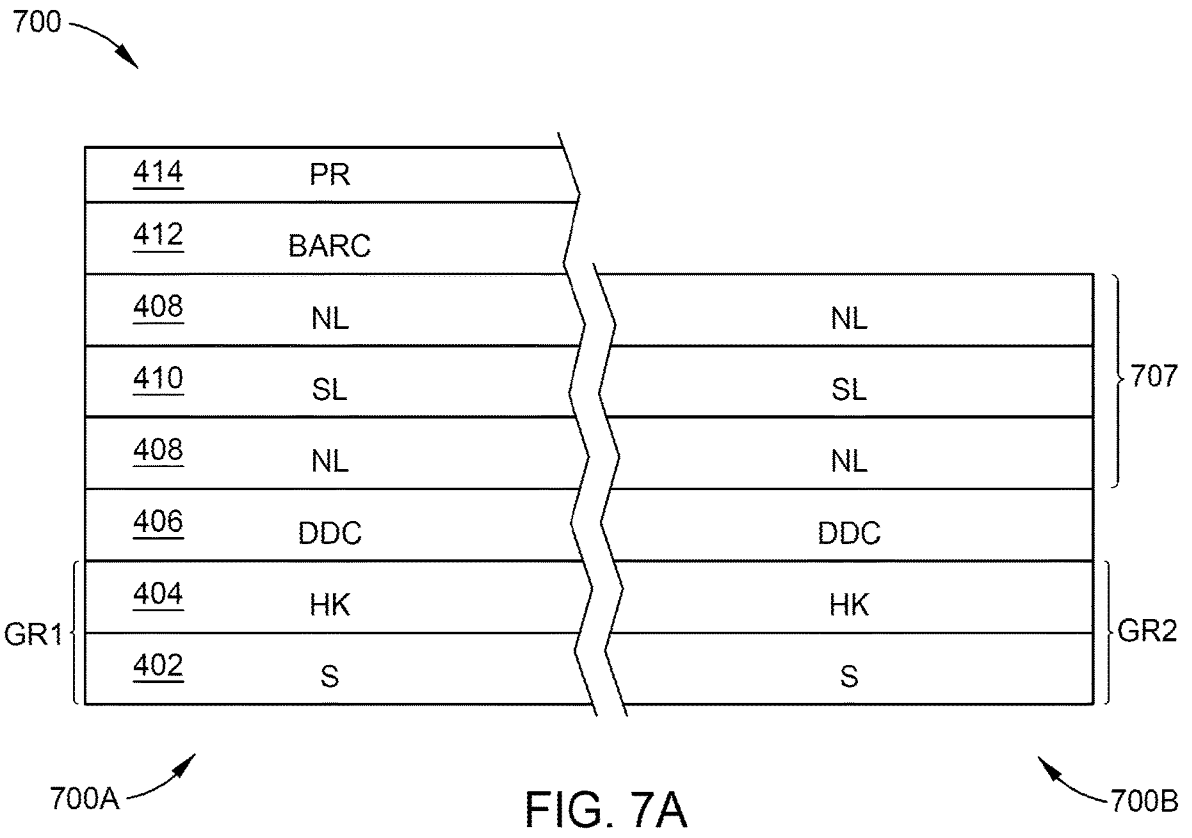
FIGS. 7A-7D illustrate schematic cross-sectional side view of a structure including a multi-layer hardmask disposed on a substrate at various stages of processing, according to some embodiments.

FIGS. 7A-7D illustrate schematic cross-sectional side views of a structure 700 that includes a multi-layer hardmask 707 disposed on a substrate at various stages of processing, according to some embodiments. The structure 700 is similar to the structure 400 described relative to FIG. 4B, except the hardmask 707 of FIG. 7A includes an additional metal nitride layer 408, such as titanium nitride, disposed over the amorphous silicon layer 410 of the hardmask 707. FIG. 7A, depicts a structure corresponding to FIG. 4B, after activities 302-312 are completed.

Figure 7B:
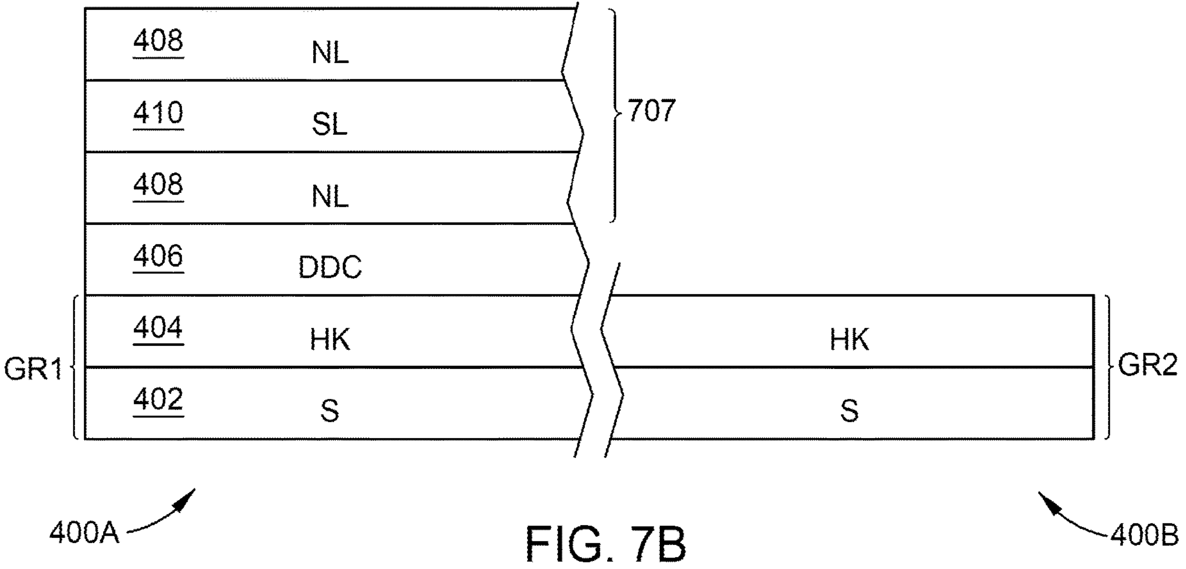
Figure 7C:
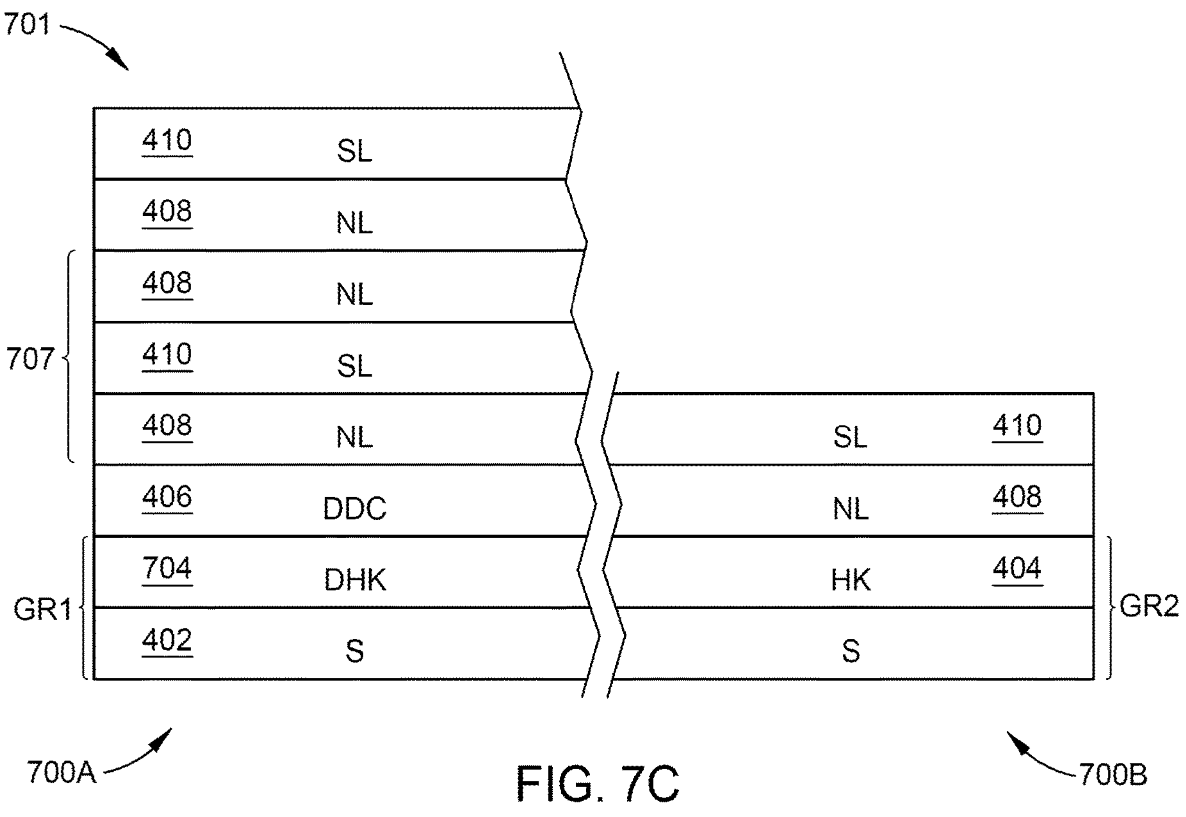
Figure 7D:
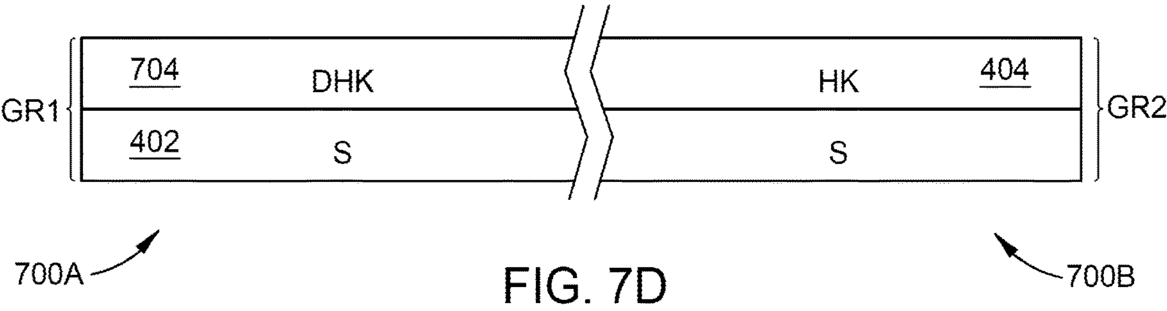

The additional metal nitride layer 408 provides protection for the film stack to potential oxidation and exposure to etchants. FIG. 7B illustrates the structure after the hardmask 707 and dipole containing layer 406 is removed from the second region 700B, as described in activity 313 of method 300. The structure depicted in FIG. 7B can be annealed to convert the dielectric layer 404 to a dipole doped dielectric layer 704, and the dipole doped dielectric layer 704 can be exposed, as described in activity 318, as shown in FIG. 7D. After performing activities 302-320, additional steps will be performed on the substrate 402 to form FET devices that include the dipole dopants containing first region 700A (e.g., GR1) disposed in the dielectric layer 704 and FET devices that include the second region 700B (e.g., GR2) of the dielectric layer 404 to form devices that have differing and desirable $V_t$ characteristics. In some embodiments, a first field-effect-transistor (FET) is formed that has a first voltage threshold ($V_t$) value. The first field-effect-transistor (FET) includes at least a portion of the dielectric layer found in the first region (e.g., GR1) after the substrate was exposed to the annealing process. In some embodiments, a second field-effect-transistor (FET) is formed that has a second voltage threshold ($V_t$) value. The second field-effect-transistor (FET) includes at least a portion of the dielectric layer found in the second region (e.g., GR2) after the substrate was exposed to the annealing process. The first voltage threshold ($V_t$) is different from the second voltage threshold ($V_t$).

Alternatively, additionally optional metal nitride layers 408, and silicon layers 410 can be formed over the hardmask 707 in the first region 700A and over the second region 700B prior to annealing activity 318, such as in optional activities 316 and 317. The additional layers can be alternated. The patterned structure 701 can be etched as described in activity 320 of method 300. After performing activities 302-320, additional steps will be performed on the substrate 402 to form FET devices that include the dielectric layer 704 that includes the dipole dopant containing first region 700A (e.g., GR1) and FET devices that include the dielectric layer 404 in the second region 700B (e.g., GR2) to form devices that have differing and desirable $V_t$ characteristics. In some embodiments, a first field-effect-transistor (FET) is formed that has a first voltage threshold ($V_t$) value. The first field-effect-transistor (FET) includes at least a portion of the dielectric layer found in the first region (e.g., GR1) after the substrate was exposed to the annealing process. In some embodiments, a second field-effect-transistor (FET) is formed that has a second voltage threshold ($V_t$) value. The second field-effect-transistor (FET) includes at least a portion of the dielectric layer found in the second region (e.g., GR2) after the substrate was exposed to the annealing process. The first voltage threshold ($V_t$) is different from the second voltage threshold ($V_t$).

While the foregoing is directed to implementations of the present disclosure, other and further implementations of the present disclosure may be devised without departing from the basic scope thereof, and the scope thereof is determined by the claims that follow.

What is claimed is:

1. A method of forming a structure on a substrate, the method comprising:

depositing a dipole dopant containing layer comprising a dipole dopant on a first region and a second region of a dielectric layer formed on the substrate;

depositing a hardmask over the dipole dopant containing layer deposited on the first and the second regions;

forming a patterned photoresist layer over the hardmask, wherein the patterned photoresist layer comprises a first portion that is positioned over the first region and an opening in the patterned photoresist layer that is positioned to expose a portion of the hardmask that is disposed over the second region of the substrate;

exposing the substrate to an etchant to etch the hardmask and dipole dopant containing layer within the second region and expose at least a portion of the dielectric layer within the second region;

removing the patterned photoresist layer from the substrate; and annealing the substrate to diffuse the dipole dopant into a portion of the dielectric layer disposed in the first region.

2. The method of claim 1, wherein a dipole dopant concentration in the dipole dopant containing layer is about 1% to about 20%.

3. The method of claim 1, further comprising selecting a dipole dopant concentration in the dipole dopant containing layer based on a predetermined concentration of dopant to be diffused into the dielectric layer of the first region.

4. The method of claim 3, wherein the predetermined concentration of dopant to be diffused into the dielectric layer is determined based on a predetermined threshold voltage of the first region or a predetermined difference in threshold voltage of the first region relative to the second region.

5. The method of claim 1, depositing a dipole dopant containing layer comprises depositing a higher concentration of dipole dopant at a first surface disposed between the dipole dopant containing layer and the dielectric layer relative to a second surface of the dipole dopant containing layer, the second surface opposing the first surface.

6. The method of claim 1, further comprising, after annealing, etching the first and second region to expose the portion of the dielectric layer comprising dipole dopant in the first region and the dielectric layer in the second region using a first etchant and a second etchant, the first etchant comprising water, ammonium hydroxide, and hydrogen peroxide, the second etchant comprising hydrogen chloride and hydrogen peroxide.

7. A method of forming a structure on a substrate, the method comprising:

depositing a dipole dopant containing layer comprising a dipole dopant on a first region and a second region of a dielectric layer formed on a substrate;

depositing a hardmask comprising an amorphous silicon-containing layer over the dipole dopant containing layer;

forming a patterned photoresist layer over the hardmask, wherein the patterned photoresist layer comprises a first portion that positioned over the first region and an opening in the patterned photoresist layer that is positioned to expose a portion of the hardmask that is disposed over the second region of the substrate;

exposing the patterned photoresist layer and substrate to an etchant to etch the hardmask and dipole dopant containing layer and expose at least a portion of the dielectric layer within the second region;

removing the patterned photoresist layer; and annealing the substrate to diffuse the dipole dopant into a first portion of the dielectric layer disposed in the first region.

8. The method of claim 7, wherein the hardmask comprises a titanium nitride layer disposed below the amorphous silicon-containing layer.

9. The method of claim 8, wherein exposing the patterned photoresist layer and substrate to an etchant includes exposing the substrate to a first etchant and a second etchant, the first etchant comprising water, ammonium hydroxide, and hydrogen peroxide, and the second etchant comprising hydrogen chloride and hydrogen peroxide.

10. The method of claim 7, further comprising, before annealing, depositing a titanium nitride layer over the hardmask in the first region and over the dielectric layer in the second region; and depositing an amorphous silicon-containing layer over the titanium nitride layer.

11. The method of claim 10, further comprising etching the annealed substrate to expose the first portion of the dielectric layer comprising the dipole dopant in the first region and a second portion of the dielectric layer in the second region.

12. The method of claim 7, wherein the hardmask comprises a titanium nitride layer below and above the amorphous silicon-containing layer.

* * * * *